United States Patent
Qi et al.

(10) Patent No.: US 11,774,656 B2
(45) Date of Patent: Oct. 3, 2023

(54) POLARIZER, METHOD FOR MANUFACTURING SAME, AND DISPLAY DEVICE

(71) Applicants: Chengdu BOE Optoelectronics Technology Co., Ltd., Sichuan (CN); BOE Technology Group Co., Ltd., Beijing (CN)

(72) Inventors: Puyu Qi, Beijing (CN); Bing Zhang, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 252 days.

(21) Appl. No.: 16/993,453

(22) Filed: Aug. 14, 2020

(65) Prior Publication Data

US 2021/0132277 A1      May 6, 2021

(30) Foreign Application Priority Data

Oct. 30, 2019 (CN) .......................... 201911046998.8

(51) Int. Cl.
*G02B 5/30* (2006.01)
*G02B 5/22* (2006.01)
(Continued)

(52) U.S. Cl.
CPC .......... *G02B 5/3083* (2013.01); *G02B 5/223* (2013.01); *G02B 5/3016* (2013.01);
(Continued)

(58) Field of Classification Search
CPC .... G02B 5/3083; G02B 5/223; G02B 5/3016; H01L 51/5293; H01L 51/5281; C09K 2323/00; C09K 2323/03; C09K 2323/031
(Continued)

(56) References Cited

U.S. PATENT DOCUMENTS 9,753,200 B2    9/2017   Lee et al.
2006/0177605 A1   8/2006   Lub et al.
(Continued)

FOREIGN PATENT DOCUMENTS

CN       1761893 A     4/2006
CN       1791833 A     6/2006
(Continued)

OTHER PUBLICATIONS

First office action of Chinese application No. 201911046998.8 dated Mar. 17, 2021.

*Primary Examiner* — Ruiyun Zhang
(74) *Attorney, Agent, or Firm* — Lippes Mathias LLP

(57) ABSTRACT

Disclosed are a polarizer, a method for manufacturing the same, and a display device. The polarizer includes an optical retardation layer and a linear polarization layer which are laminated, wherein the optical retardation layer includes at least two types of retardation regions for performing phase retardation on incident light, a phase retardation amount of each type of retardation region including a quarter of a wavelength of light of one color, and the phase retardation amounts of the at least two types of retardation regions including quarters of wavelengths of light of at least two different colors. The present disclosure is favorable to improving the color cast of the display device.

10 Claims, 7 Drawing Sheets

(51) Int. Cl.
*H10K 50/80* (2023.01)
*H10K 50/86* (2023.01)

(52) U.S. Cl.
CPC ....... *H10K 50/868* (2023.02); *C09K 2323/00* (2020.08); *C09K 2323/03* (2020.08); *C09K 2323/031* (2020.08); *H10K 50/86* (2023.02)

(58) Field of Classification Search
USPC ...................... 428/1.1, 1.3, 1.31; 359/483.01
See application file for complete search history.

(56) References Cited

U.S. PATENT DOCUMENTS

| | | | |
|---|---|---|---|
| 2006/0256263 A1 | 11/2006 | Shimizu et al. | |
| 2008/0002111 A1 | 1/2008 | Roh | |
| 2009/0168001 A1 | 7/2009 | Ichihashi | |
| 2012/0099054 A1 | 4/2012 | Takeuchi et al. | |
| 2018/0174508 A1 | 6/2018 | Jeong et al. | |
| 2020/0264475 A1* | 8/2020 | Yoshinari | G09F 9/30 |

FOREIGN PATENT DOCUMENTS

| | | | |
|---|---|---|---|
| CN | 101097346 A | 1/2008 | |
| CN | 101331426 A | 12/2008 | |
| CN | 102498421 A | 6/2012 | |
| CN | 104656180 A | 5/2015 | |
| CN | 104903764 A | 9/2015 | |
| CN | 108206199 A | 6/2018 | |
| CN | 108666357 A | 10/2018 | |
| CN | 109324438 A | 2/2019 | |
| CN | 110133909 A | 8/2019 | |
| EP | 0994775 A4 | 4/2003 | |
| WO | WO9902340 A1 | 1/1999 | |
| WO | WO-2019093446 A1 * | 5/2019 | G02B 27/286 |

* cited by examiner

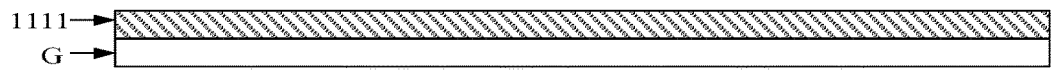

FIG. 11

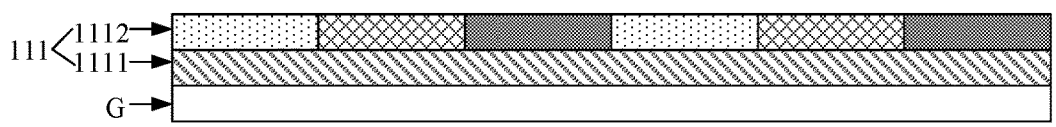

FIG. 12

| Forming a linear polarization alignment sub-layer on the optical retardation layer, the included angle between an alignment direction of the linear polarization alignment sub-layer and an alignment direction of the retardation alignment sub-layer being 45 degrees | 9031 |
|---|---|
| Forming a dye liquid crystal sub-layer on the linear polarization alignment sub-layer by using the mixed material of a secondary dye and a polymer liquid crystal | 9032 |

FIG. 13

POLARIZER, METHOD FOR MANUFACTURING SAME, AND DISPLAY DEVICE

The present application claims priority to Chinese Patent Application No. 201911046998.8, filed on Oct. 30, 2019 and titled "POLARIZER, METHOD FOR MANUFACTURING SAME, AND DISPLAY DEVICE", which is incorporated herein by reference in its entirety.

TECHNICAL FIELD

The present disclosure relates to a polarizer, a method for manufacturing the same, and a display device.

BACKGROUND

An organic light-emitting diode (OLED) display device usually includes an OLED display panel and a polarizer disposed on a light-emergent side of the OLED display panel. The polarizer is configured to absorb external light to avoid an impact of the external light on a display effect of the OLED display panel.

SUMMARY

The present disclosure provides a polarizer, a method for manufacturing the same, and a display device. The technical solutions of the present disclosure are as follows.

In a first aspect, a polarizer is provided. The polarizer includes:

an optical retardation layer and a linear polarization layer which are laminated, wherein the optical retardation layer includes at least two types of retardation regions for performing phase retardation on incident light, a phase retardation amount of each type of the retardation regions including a quarter of a wavelength of light of one color, and the phase retardation amounts of the at least two types of retardation regions including quarters of wavelengths of light of at least two different colors.

Optionally, each type of the retardation regions has a phase retardation amount range; wherein the phase retardation amount ranges of the at least two types of retardation regions are different from one another, each of the phase retardation amount ranges includes a quarter of the wavelength of light of one color, and the phase retardation amount ranges of the at least two types of retardation regions include quarters of the wavelengths of the light of at least two different colors.

Optionally, the at least two types of retardation regions include a first retardation region, a second retardation region, and a third retardation region; wherein the phase retardation amount of the first retardation region includes a quarter of the wavelength of blue light;

the phase retardation amount of the second retardation region includes a quarter of the wavelength of green light; and the phase retardation amount of the third retardation region includes a quarter of the wavelength of red light.

Optionally, the phase retardation amount range of the first retardation region is 107.5 to 117.5 nanometers;

the phase retardation amount range of the second retardation region is 132.5 to 142.5 nanometers; and the phase retardation amount range of the third retardation region is 157.5 to 167.5 nanometers.

Optionally, a thickness of the first retardation region, a thickness of the second retardation region, and a thickness of the third retardation region are all equal; a refractive index difference of the first retardation region, a refractive index difference of the second retardation region, and a refractive index difference of the third retardation region are not equal from one another; and the refractive index difference of any one of the retardation regions is a difference between a refractive index of the retardation region for ordinary light and a refractive index of the retardation region for extraordinary light.

Optionally, the optical retardation layer includes a retardation alignment sub-layer and a liquid crystal sub-layer, wherein the retardation alignment sub-layer is configured to align the liquid crystal sub-layer, and in the liquid crystal sub-layer, a liquid crystal of the first retardation region, a liquid crystal of the second retardation region, and a liquid crystal of the third retardation region are different from one another.

Optionally, a thickness of the first retardation region, a thickness of the second retardation region, a the thickness of the third retardation region are not equal from one another; a refractive index difference of the first retardation region, a refractive index difference of the second retardation region, and a refractive index difference of the third retardation region are all equal; and the refractive index difference of any one of the retardation regions is a difference between a refractive index of the retardation region for ordinary light and a refractive index of the retardation region for extraordinary light.

Optionally, the optical retardation layer includes a retardation alignment sub-layer and a liquid crystal sub-layer; wherein the retardation alignment sub-layer is configured to align the liquid crystal sub-layer, and in the liquid crystal sub-layer, a liquid crystal of the first retardation region, a liquid crystal of the second retardation region, and a liquid crystal of the third retardation region are the same.

Optionally, an area of the first retardation region, an area of the second retardation region, and an area of the third retardation region are all equal.

Optionally, an area of the first retardation region is equal to an area of the third retardation region, and an area of the second retardation region is greater than an area of the first retardation region.

Optionally, the optical retardation layer includes a plurality of phase retardation units arranged in an array; wherein each of the phase retardation units includes the first retardation region, the second retardation region, and the third retardation region.

Optionally, slow axis directions of all the retardation regions in the optical retardation layer are parallel, and an included angle between the slow axis direction of the retardation region and an absorption axis of the linear polarization layer is 45 degrees.

Optionally, the linear polarization layer includes a linear polarization alignment sub-layer and a dye liquid crystal sub-layer which are laminated; wherein a material of the dye liquid crystal sub-layer includes a mixed material of a secondary dye and a polymer liquid crystal, and the linear polarization alignment sub-layer is configured to align the dye liquid crystal sub-layer, wherein the secondary dye includes at least one of an azo dye, an anthraquinone dye, or an azomethine dye.

Optionally, the at least two types of retardation regions include a first retardation region, a second retardation region, and a third retardation region, wherein a phase retardation amount range of the first retardation region is 107.5 to 117.5 nanometers, a phase retardation amount range of the second retardation region is 132.5 to 142.5 nanometers, and a phase retardation amount range of the third retardation region is 157.5 to 167.5 nanometers;

a thickness of the first retardation region, a thickness of the second retardation region, and a thickness of the third retardation region are all equal; the optical retardation layer includes a retardation alignment sub-layer and a liquid crystal sub-layer, wherein the retardation alignment sub-layer is configured to align the liquid crystal sub-layer, and in the liquid crystal sub-layer, a liquid crystal of the first retardation region, a liquid crystal of the second retardation region, and a liquid crystal of the third retardation region are different from one another, such that a refractive index difference of the first retardation region, a refractive index difference of the second retardation region, and a refractive index difference of the third retardation region are not equal from one another, and the refractive index difference of any one of the retardation regions is a difference between a refractive index of the retardation region for ordinary light and a refractive index of the retardation region for extraordinary light; and the linear polarization layer includes a linear polarization alignment sub-layer and a dye liquid crystal sub-layer which are laminated, wherein a material of the dye liquid crystal sub-layer includes a mixed material of a secondary dye and a polymer liquid crystal, and the linear polarization alignment sub-layer is configured to align the dye liquid crystal sub-layer, wherein the secondary dye includes at least one of an azo dye, an anthraquinone dye, or an azomethine dye.

Optionally, the at least two types of retardation regions include a first retardation region, a second retardation region, and a third retardation region, wherein a phase retardation amount range of the first retardation region is 107.5 to 117.5 nanometers, a phase retardation amount range of the second retardation region is 132.5 to 142.5 nanometers, and a phase retardation amount range of the third retardation region is 157.5 to 167.5 nanometers;

a thickness of the first retardation region, a thickness of the second retardation region, and a thickness of the third retardation region are not equal from one another; the optical retardation layer includes a retardation alignment sub-layer and a liquid crystal sub-layer, wherein the retardation alignment sub-layer is configured to align the liquid crystal sub-layer, and in the liquid crystal sub-layer, a liquid crystal of the first retardation region, a liquid crystal of the second retardation region, and a liquid crystal of the third retardation region are all the same, such that a refractive index difference of the first retardation region, a refractive index difference of the second retardation region, and a refractive index difference of the third retardation region are all equal, and the refractive index difference of any one of the retardation regions is a difference between a refractive index of the retardation region for ordinary light and a refractive index of the retardation region for extraordinary light; and the linear polarization layer includes a linear polarization alignment sub-layer and a dye liquid crystal sub-layer which are laminated, wherein a material of the dye liquid crystal sub-layer includes a mixed material of a secondary dye and a polymer liquid crystal, and the linear polarization alignment sub-layer is configured to align the dye liquid crystal sub-layer, wherein the secondary dye includes at least one of an azo dye, an anthraquinone dye, or an azomethine dye.

In a second aspect, a method for manufacturing a polarizer is provided. The method includes:

forming an optical retardation layer and a linear polarization layer which are laminated, the optical retardation layer including at least two types of retardation regions for performing phase retardation on incident light;

wherein a phase retardation amount of each type of the retardation regions includes a quarter of a wavelength of light of one color, and the phase retardation amounts of the at least two types of retardation regions include quarters of wavelengths of light of at least two different colors.

Optionally, forming the optical retardation layer and the linear polarization layer which are laminated includes:

forming the optical retardation layer including includes a first retardation region, a second retardation region, and a third retardation region, wherein a thickness of the first retardation region, a thickness of the second retardation region, and a thickness of the third retardation region are all equal, a refractive index difference of the first retardation region, a refractive index difference of the second retardation region, and a refractive index difference of the third retardation region are not equal from one another, the refractive index difference of any one of the retardation regions is a difference between a refractive index of the retardation region for ordinary light and a refractive index of the retardation region for extraordinary light, and slow axis directions of all the retardation regions in the optical retardation layer are parallel; and forming the linear polarization layer on the optical retardation layer, wherein an included angle between an absorption axis of the linear polarization layer and the slow axis direction of the retardation region is 45 degrees.

Optionally, forming the optical retardation layer includes:

forming a retardation alignment sub-layer; and forming a liquid crystal sub-layer on the retardation alignment sub-layer, wherein in the liquid crystal sub-layer, a liquid crystal of the first retardation region, a liquid crystal of the second retardation region, and a liquid crystal of the third retardation region are different from one another.

Optionally, forming the linear polarization layer on the optical retardation layer includes:

forming a linear polarization alignment sub-layer on the optical retardation layer, wherein an included angle between an alignment direction of the linear polarization alignment sub-layer and an alignment direction of the retardation alignment sub-layer is 45 degrees; and forming a dye liquid crystal sub-layer on the linear polarization alignment sub-layer by using the mixed material of a secondary dye and a polymer liquid crystal, wherein the secondary dye includes at least one of an azo dye, an anthraquinone dye, or an azomethine dye.

Optionally, forming the optical retardation layer and the linear polarization layer which are laminated includes:

forming the optical retardation layer comprising a first retardation region, a second retardation region, and a third retardation region, wherein a thickness of the first retardation region, a thickness of the second retardation region, and a thickness of the third retardation region are not equal from one another, a refractive index difference of the first retardation region, a refractive index difference of the second retardation region, and a refractive index difference of the third retardation region are all equal, the refractive index difference of any one of the retardation regions is a difference between a refractive index of the retardation region for ordinary light and a refractive index of the retardation region for extraordinary light, and slow axis directions of all the retardation regions in the optical retardation layer are parallel; and forming the linear polarization layer on the optical retardation layer, wherein an included angle between the absorption axis of the linear polarization layer and the slow axis direction of the retardation region is 45 degrees.

Optionally, forming the optical retardation layer includes:
forming a retardation alignment sub-layer; and
forming a liquid crystal sub-layer on the retardation alignment sub-layer, wherein in the liquid crystal sub-layer, a liquid crystal of the first retardation region, a liquid crystal of the second retardation region, and a liquid crystal of the third retardation region are all the same.

Optionally, forming the linear polarization layer on the optical retardation layer includes:
forming a linear polarization alignment sub-layer on the optical retardation layer, wherein an included angle between the alignment direction of the linear polarization alignment sub-layer and the alignment direction of the retardation alignment sub-layer is 45 degrees; and
forming a dye liquid crystal sub-layer on the linear polarization alignment sub-layer by using the mixed material of a secondary dye and a polymer liquid crystal, wherein the secondary dye includes at least one of an azo dye, an anthraquinone dye or an azomethine dye.

In a third aspect, a display device is provided. The display device includes:
a display panel, and a polarizer on a light-emergent side of the display panel according to the first aspect, wherein the polarizer includes an optical retardation layer and a linear polarization layer which are laminated, the optical retardation layer being between the linear polarization layer and the display panel.

Optionally, the display device further includes:
a touch layer on one side of the polarizer distal from the display panel; and
a protective layer on one side of the touch layer distal from the display panel.

BRIEF DESCRIPTION OF THE DRAWINGS

To describe the technical solutions in the embodiments of the present disclosure more clearly, the following briefly introduces the accompanying drawings required for describing the embodiments. Apparently, the accompanying drawings in the following description show merely some embodiments of the present disclosure, and a person of ordinary skill in the art may still derive other drawings from these accompanying drawings without creative efforts.

FIG. 11 is a schematic diagram after an alignment sub-layer is formed on a base substrate according to an embodiment of the present disclosure;

FIG. 12 is a schematic diagram after a liquid crystal sub-layer is formed on an alignment sub-layer according to an embodiment of the present disclosure;

FIG. 13 is a flowchart of a method of forming a linear polarization layer according to an embodiment of the present disclosure;

The accompanying drawings incorporated in the description and forming a part thereof illustrate the embodiments of the present disclosure and are used to explain the principle of the present disclosure.

DETAILED DESCRIPTION

In order to clarify the principles, technical solutions, and advantages of the present disclosure, the present disclosure will be described in detail below in conjunction with the accompanying drawings. Obviously, the described embodiments are only a part not all of the embodiments of the present disclosure. Based on the embodiments in the present disclosure, all other embodiments obtained by those of ordinary skill in the art without creative work shall fall within the protection scope of the present disclosure.

The metal cathode in an OLED display panel is easy to reflect external light, resulting in a lower contrast and visibility of the OLED display panel. Therefore, a polarizer is usually attached to a light-emergent side of the OLED display panel to absorb the external light, thereby improving the contrast and visibility of the OLED display panel.

At present, the polarizer includes a quarter-wave plate retardation layer and a linear polarization layer which are laminated. After the polarizer is attached to the light-emergent side of the OLED display panel, the quarter-wave plate retardation layer is disposed between the OLED display panel and the linear polarization layer. The quarter-wave plate retardation layer is configured to perform quarter-phase retardation on the light passing through the quarter-wave plate retardation layer, such that the polarizer can absorb the external light.

Figure 1:
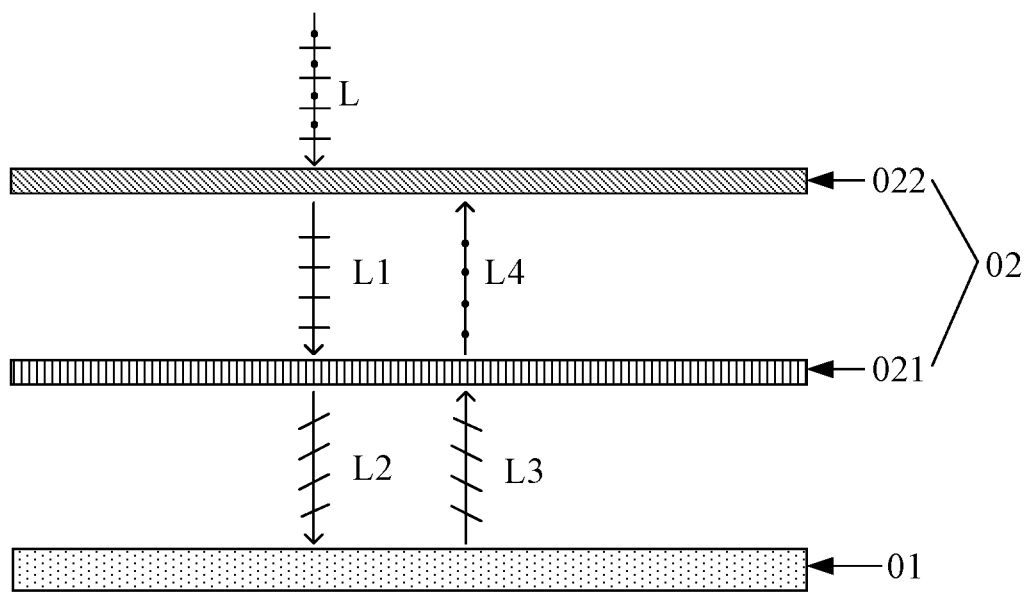
FIG. 1 is a propagation schematic diagram of external light in an OLED display device according to an embodiment of the present disclosure.

Exemplarily, referring to FIG. 1, FIG. 1 shows a principle diagram of absorbing the external light by a polarizer according to an embodiment of the present disclosure. In order to clearly show the process of absorbing the external light by the polarizer, the OLED display panel 01 and the polarizer 02 are disassembled and drawn in FIG. 1. Referring to FIG. 1, the polarizer 02 is disposed on the light-emergent side of the OLED display panel 01. The polarizer 02 includes a quarter-wave plate retardation layer 021 and a linear polarization layer 022 which are laminated. The quarter-wave plate retardation layer 021 is disposed between the OLED display panel 01 and the linear polarization layer 022. When the external light L emitted toward the OLED display panel 01 passes through the linear polarization layer 022, the linear polarization layer 022 absorbs the light, of which the polarization direction is perpendicular to the polarization direction of the linear polarization layer 022, in the external light L, such that the linear polarization light L1, of which the polarization direction is parallel to the polarization direction of the linear polarization layer 022, in the external light L, is transmitted. When the linear polarization light L1 passes through the quarter-wave plate retardation layer 021, the quarter-wave plate retardation layer 021 performs quarter-phase retardation on the linear polarization light L1, such that the polarization direction of the linear polarization light L1 is rotated leftward to form circular polarization light L2. When the circular polarization light L2 is irradiated on the OLED display panel 01, the metal cathode in the OLED display panel 01 (not shown in FIG. 1) reflects the circular polarization light L2 to cause half-wave loss of the circular polarization light L2. The polarization direction of the circular polarization light L2 is reversed (from leftward rotation to rightward rotation) to form circular polarization light L3. When the circular polarization light L3 passes through the quarter-wave plate retardation layer 021, the quarter-wave plate retardation layer 021 performs quarter-phase retardation on the circular polarization light L3, such that the circular polarization light L3 is converted to linear polarization light L4 of which the polarization direction is perpendicular to the polarization direction of the linear polarization layer 022. Since the polarization direction of the linear polarization light L4 is perpendicular to the polarization direction of the linear polarization layer 022, the linear polarization light L4 cannot be transmitted from the linear polarization layer 022. It can be considered that in the whole process, the polarizer 02 absorbs the external light L to prevent the external light L from being reflected by the metal cathode in the OLED display panel 01.

The ideal quarter-wave plate retardation layer can perform quarter-phase retardation on the light of all wavelengths. However, it is difficult for the actual quarter-wave plate retardation layer to achieve quarter-wave retardation for the light of all wavelengths, such that the quarter-wave plate retardation layer fails to meet the quarter-phase retardation of the light of different colors. The phase retardation amount when the light of different colors passes through the quarter-wave plate retardation layer is different. Therefore, the degree of absorption of the polarizer for the light of different colors is different, which results in color cast of the OLED display device. Exemplarily, in red, green and blue light, the green light has the highest brightness. Therefore, when the quarter-wave plate retardation layer is designed, it is usually firstly considered that the phase retardation amount of the quarter-wave plate retardation layer is equal to a quarter of the wavelength of the green light. In this way, the polarizer can completely absorb the green light, but cannot completely absorb the red and blue light. Consequently, a part of the red and blue light is reflected by the metal cathode in the OLED display panel. The reflected red light and blue light are superimposed to form purple light, eventually resulting in the condition that a screen of the OLED display panel appears to be purple.

In view of this, the embodiments of the present disclosure provide a polarizer, a method for manufacturing the same, and a display device. The polarizer includes an optical retardation layer and a linear polarization layer which are laminated, and the optical retardation layer includes at least two types of retardation regions for performing phase retardation on incident light. The phase retardation amount of each type of retardation region includes a quarter of a wavelength of light of one color, and the phase retardation amounts of the at least two types of retardation regions include quarters of wavelengths of light of at least two different colors. Therefore, each of the at least two types of retardation regions can perform quarter-phase retardation on the light of one color, and the at least two types of retardation regions can perform quarter-phase retardation on the light of at least two different colors, such that the polarizer completely absorbs the light of at least two different colors, which is favorable to improving the color cast of the display device. The description of the following embodiments is referred for detailed solutions of the embodiments of the present disclosure.

Figure 2:
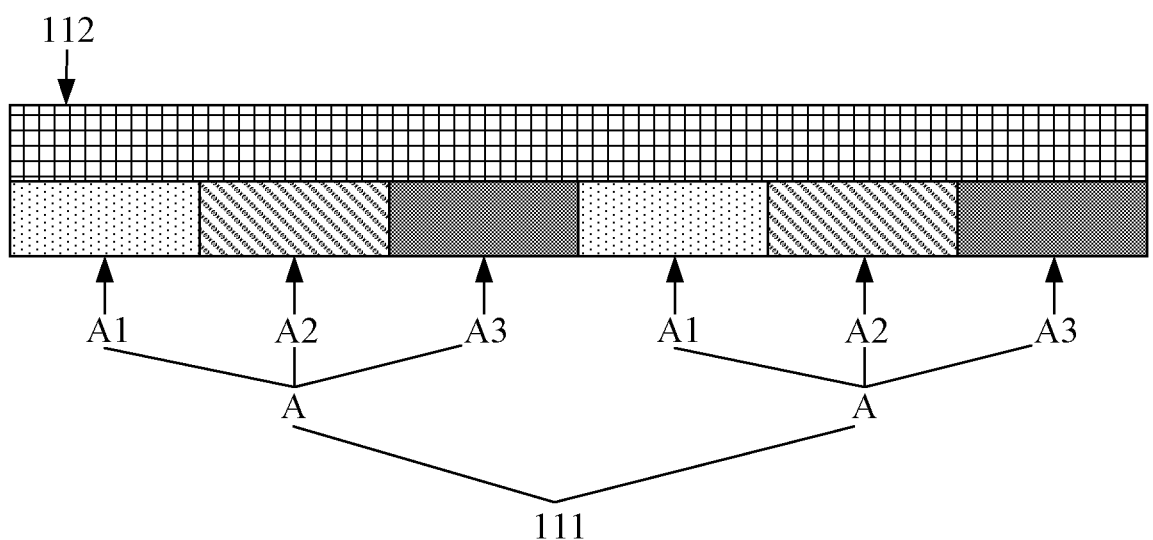
FIG. 2 is a schematic structural diagram of a polarizer according to an embodiment of the present disclosure.

Referring to FIG. 2, FIG. 2 shows a schematic structural diagram of a polarizer 11 according to an embodiment of the present disclosure. Referring to FIG. 2, the polarizer 11 includes an optical retardation layer 111 and a linear polarization layer 112 which are laminated. The optical retardation layer includes at least two types of retardation regions for performing phase retardation on incident light (not shown in FIG. 2). A phase retardation amount of each type of retardation region includes a quarter of a wavelength of light of one color, and the phase retardation amounts of the at least two types of retardation regions include quarters of wavelengths of light of at least two different colors. That is, each of the at least two types of retardation regions can perform quarter-phase retardation on the light of one color, and the at least two types of retardation regions can perform quarter-phase retardation on the light of at least two different colors.

In summary, in the polarizer according to the embodiment of the present disclosure, the optical retardation layer of the polarizer includes at least two types of retardation regions for performing phase retardation on the incident light, a phase retardation amount of each type of retardation region includes a quarter of a wavelength of light of one color, and the phase retardation amounts of the at least two types of retardation regions include quarters of wavelengths of light of at least two different colors. Therefore, the optical retardation layer can perform quarter-phase retardation on the light of at least two different colors, such that the polarizer completely absorbs the light of at least two different colors, which is favorable to improving the color cast of the display device.

Optionally, each of the at least two types of retardation regions has a phase retardation amount range, and the phase retardation amount ranges of the at least two types of retardation regions are different. Each phase retardation amount range includes a quarter of a wavelength of the light of one color, and the phase retardation amount ranges of the at least two types of retardation regions include quarters of wavelengths of the light of at least two different colors. Since each phase retardation amount range contains a quarter of the wavelength of the light of one color, the retardation region corresponding to the phase retardation amount range can perform quarter-phase retardation on the light of one color, and the at least two types of retardation regions can perform quarter-phase retardation on the light of at least two different colors. Optionally, each retardation region may be a quarter-wave plate retardation region, and the at least two retardation regions are at least two different quarter-wave plate retardation regions.

Optionally, as shown in FIG. 2, the at least two types of retardation regions include a first retardation region A1, a second retardation region A2, and a third retardation region A3. The phase retardation amount of the first retardation region A1 includes a quarter of the wavelength of blue light, and the first retardation region A1 can perform quarter-phase retardation on the blue light. The phase retardation amount of the second retardation region A2 includes a quarter of the wavelength of green light and the second retardation region A2 can perform quarter-phase retardation on the green light. The phase retardation amount of the third retardation region A3 includes a quarter of the wavelength of the red light, and the third retardation region A3 can perform quarter-phase retardation on the red light.

Optionally, in the embodiment of the present disclosure, the wavelength of the blue light is approximately 450 nanometers (nm), the wavelength of the green light is approximately 550 nm, and the wavelength of the red light is approximately 650 nm. Then a quarter of the wavelength of the blue light is 112.5 nm, a quarter of the wavelength of the green light is 137.5 nm, and a quarter of the wavelength of the red light is 162.5 nm. The phase retardation amount of the first retardation region A1 may include 112.5 nm, the phase retardation amount of the second retardation region A2 may include 137.5 nm, and the phase retardation amount of the third retardation region A3 may include 162.5 nm. Considering the deviation of design and manufacturing processes, in the embodiment of the present disclosure, the phase retardation amount range of the first retardation region A1 is 107.5 to 117.5 nm, the phase retardation amount range of the second retardation region A2 is 132.5 to 142.5 nm, and the phase retardation amount range of the third retardation region A3 is 157.5 to 167.5 nm.

Optionally, a thickness of the optical retardation layer 111 ranges from 1 to 2 micrometers (μm), and a thicknesses of different regions in the optical retardation layer 111 may be equal or unequal. In the embodiment of the present disclosure, the at least two types of retardation regions can achieve the quarter-phase retardation for the light of at least two different colors through a combination of the refractive index difference and thickness. The refractive index difference of any retardation region is the difference between a refractive index of the retardation region for ordinary light (that is, o light) and a refractive index of the retardation region for extraordinary light (that is, e light).

Optionally, a thickness of the first retardation region A1, a thickness of the second retardation region A2, and a thickness of the third retardation region A3 are all equal; and a refractive index difference of the first retardation region A1, a refractive index difference of the second retardation region A2, and a refractive index difference of the third retardation region A3 are not equal to each other. Optionally, a thickness of the first retardation region A1, a thickness of the second retardation region A2, and a thickness of the third retardation region A3 are not equal from one another; and a refractive index difference of the first retardation region A1, a refractive index difference of the second retardation region A2, and a refractive index difference of the third retardation region A3 are all equal. In this way, the thicknesses and refractive index differences of the first retardation region A1, the second retardation region A2, and the third retardation region A3 may be respectively set, such that the phase retardation amount of the first retardation region A1 includes a quarter of the wavelength of the blue light, the phase retardation amount of the second retardation region A2 includes a quarter of the wavelength of the green light, and the phase retardation amount of the third retardation region A3 includes a quarter of the wavelength of the red light. It is easily understandable for those skilled in the art that FIG. 2 takes the fact that the thickness of the first retardation region A1, the thickness of the second retardation region A2, and the thickness of the third retardation region A3 are equal as an example for illustration.

Figure 3:
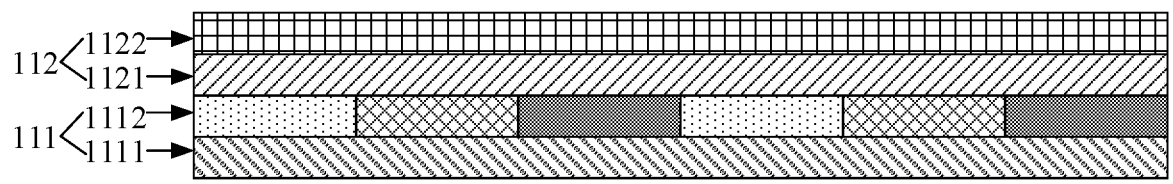
FIG. 3 is a schematic structural diagram of another polarizer according to an embodiment of the present disclosure.

Optionally, referring to FIG. 3, FIG. 3 shows a schematic structural diagram of another polarizer 11 according to an embodiment of the present disclosure. As shown in FIG. 3, the optical retardation layer 111 includes a retardation alignment sub-layer 1111 and a liquid crystal sub-layer 1112, wherein the retardation alignment sub-layer 1111 is configured to align the liquid crystal sub-layer 1112. Optionally, a material of the retardation alignment sub-layer 1111 may include polyimide (PI). When the thickness of the first retardation region A1, the thickness of the second retardation region A2, and the thickness of the third retardation region A3 are all equal, in the liquid crystal sub-layer 1112, a liquid crystal of the first retardation region A1, a liquid crystal of the second retardation region A2, and a liquid crystal of the third retardation region A3 are different from one another, such that the refractive index difference of the first retardation region A1, the refractive index difference of the second retardation region A2, and the refractive index difference of the third retardation region A3 are not equal. Optionally, when the thickness of the first retardation region A1, the thickness of the second retardation region A2, and the thickness of the third retardation region A3 are not equal from one another, in the liquid crystal sub-layer 1112, the liquid crystal of the first retardation region A1, the liquid crystal of the second retardation region A2, and the liquid crystal of the third retardation region A3 are the same, such that the refractive index difference of the first retardation region A1, the refractive index difference of the second retardation region A2, and the refractive index difference of the third retardation region A3 are not equal. It is easily understandable for those skilled in the art that FIG. 3 takes the fact that the thickness of the first retardation region A1, the thickness of the second retardation region A2, and the thickness of the third retardation region A3 are equal as an example for illustration.

Those skilled in the art easily understand that the liquid crystal is a single optical axis crystal. When a linear polarization light beam passes through the liquid crystal layer, under the action of the liquid crystal, the linear polarization light beam will form two light beams. A polarization direction of one of the two light beams is perpendicular to an optical axis of the liquid crystal, and the polarization direction of the other light beam is parallel to the optical axis of the liquid crystal. The light beam of which the polarization direction is perpendicular to the optical axis of the liquid crystal is called ordinary light, and the light beam of which the polarization direction is parallel to the optical axis of the liquid crystal is called extraordinary light. The refractive index of the liquid crystal for the ordinary light may be $n_o$, and the refractive index of the liquid crystal for the extraordinary light may be $n_e$, which is usually different from $n_o$. Therefore, the ordinary light and the extraordinary light which pass through the liquid crystal layer will have a phase difference (that is, the phase retardation). The size of the phase difference may be $\Delta\psi=(n_e-n_o)\times d$, wherein d represents the thickness of the liquid crystal layer. When the phase difference satisfies $\Delta\psi=\lambda/4$, and when the intensity of the ordinary light is equal to the intensity of the extraordinary light, the ordinary light and the extraordinary light are combined into a circular polarization light beam. With reference to such a principle, in the embodiment of the present disclosure, the optical retardation layer 111 includes a liquid crystal sub-layer 1112, and the liquid crystal sub-layer 1112 can convert the linear polarization light incident thereto into circular polarization light, such that the optical retardation layer 111 can convert the linear polarization light into the circular polarization light.

Optionally, as shown in FIG. 3, the linear polarization layer 112 includes a linear polarization alignment sub-layer 1121 and a dye liquid crystal sub-layer 1122 which are laminated, and the linear polarization alignment sub-layer 1121 is configured to align the dye liquid crystal sub-layer 1122. As shown in FIG. 3, the linear polarization alignment sub-layer 1121 is disposed between the optical retardation layer 111 and the dye liquid crystal sub-layer 1122. Optionally, a material of the retardation alignment sub-layer 1111 may be PI, a material of the dye liquid crystal sub-layer 1122 includes the mixed material of a secondary dye and a polymer liquid crystal, and the secondary dye may be at least one of an azo dye, an anthraquinone dye, or an azomethine dye.

Optionally, in an embodiment of the present disclosure, the slow axis directions of all the retardation regions in the optical retardation layer 111 are parallel, and an included angle between the slow axis direction of each retardation region and an absorption axis of the linear polarization layer 112 is 45 degrees. Exemplarily, the included angle between an alignment direction of the linear polarization alignment sub-layer 1121 and an alignment direction of the retardation alignment sub-layer 1111 is 45 degrees, such that the included angle between the slow axis direction of each retardation region and the absorption axis of the linear polarization layer 112 is 45 degrees.

Optionally, as shown in FIG. 2 and FIG. 3, the optical retardation layer 111 includes a plurality of phase retardation units A (not shown in FIG. 3) arranged in an array. Each phase retardation unit A includes at least one first retardation region A1 (not shown in FIG. 3), at least one second retardation region A2 (not shown in FIG. 3), and at least one third retardation region A3 (not shown in FIG. 3). Besides, in the optical retardation layer 111, the number of first retardation regions A1, the number of second retardation regions A2, and number of third retardation regions A3 in the area per inch are each not less than 100. Optionally, the shape of each retardation region may be a polygon, such as a triangle, a quadrangle, a pentagon, or a hexagon. The quadrangle may be a square, a rectangle, or a rhombus, and the shapes of different retardation regions may be the same or different. The value range of the side length of each retardation region may be 20 to 300 μm.

Optionally, an area of the first retardation region A1, an area of the second retardation region A2 and an area of the third retardation region A3 are equal. Optionally, an area of the first retardation region A1 and an area of the third retardation region A3 are equal, and an area of the second retardation region A2 is greater than an area of the first retardation region A1. When the area of the first retardation region A1, the area of the second retardation region A2 and the area of the third retardation region A3 are equal, the proportions of the first retardation region A1, the second retardation region A2, and the third retardation region A3 in the optical retardation layer 111 are balanced, and the inverse hue of the polarizer 11 (referring to the performance of absorbing reflected light of the polarizer 11) is optimal. When the area of the first retardation region A1 and the area of the third retardation region A3 are equal, and the area of the second retardation region A2 is greater than the area of the first retardation region A1, the polarizer 11 is enabled to absorb the blue, green and red light to the greatest extent, and the display device including the polarizer 11 has a lower reflectivity to external light.

Figure 4:
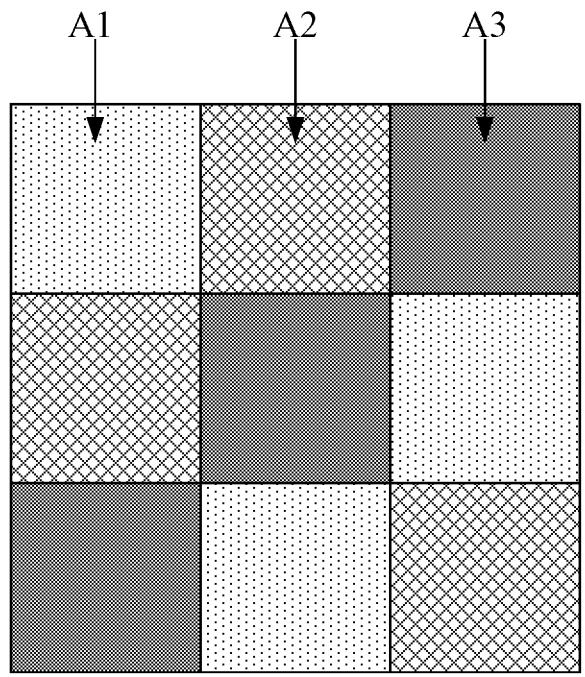
FIG. 4 is a front view of a phase retardation unit according to an embodiment of the present disclosure.
Figure 5:
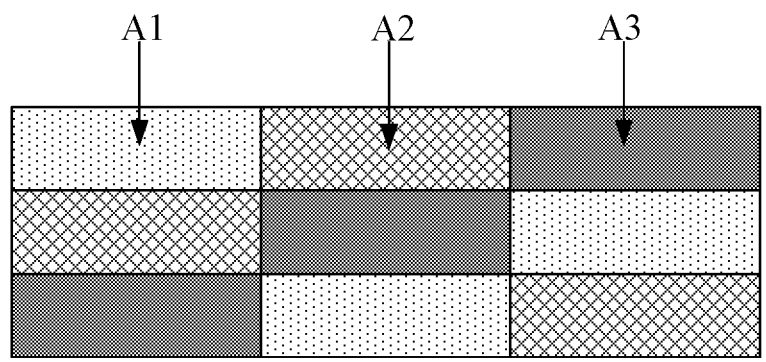
FIG. 5 is a front view of another phase retardation unit according to an embodiment of the present disclosure.
Figure 6:
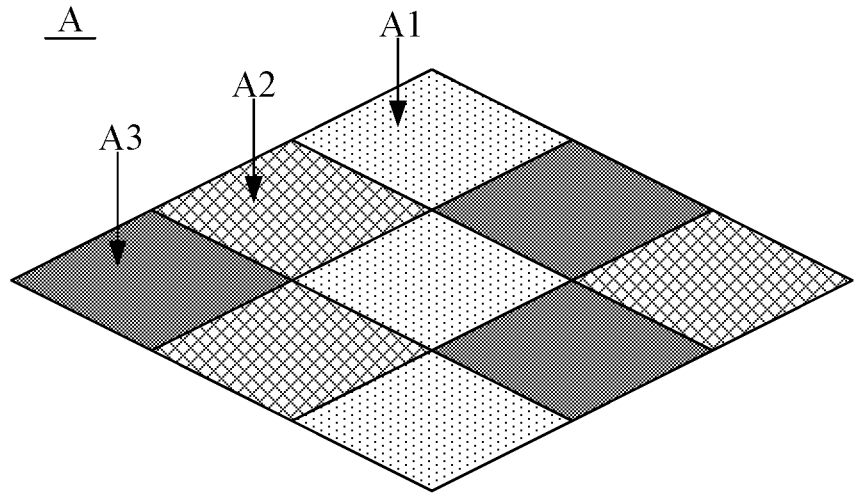
FIG. 6 is a front view of yet another phase retardation unit according to an embodiment of the present disclosure.

Exemplarily, referring to FIG. 4 to FIG. 8, FIG. 4 to FIG. 8 show front views of five phase retardation units A according to the embodiment of the present disclosure. As shown in FIG. 4 to FIG. 6, the phase retardation unit A includes three first retardation regions A1, three second retardation regions A2, and three third retardation regions A3. The first retardation region A1, the second retardation region A2, and the third retardation region A3 have the same shape and equal area. The three first retardation regions A1, the three second retardation regions A2 and the three third retardation regions A3 are arranged in a matrix into three rows and three columns. Each row has one first retardation region A1, one second retardation region A2, and one third retardation region A3, and each column has one first retardation region A1, one second retardation region A2, and one third retardation region A3. As shown in FIG. 4, the shapes of the first retardation region A1, the second retardation region A2, and the third retardation region A3 are all square. As shown in FIG. 5, the shapes of the first retardation region A1, the second retardation region A2, and the third retardation region A3 are all rectangular. As shown in FIG. 6, the shapes of the first retardation region A1, the second retardation region A2, and the third retardation region A3 are all rhombic.

Figure 7:
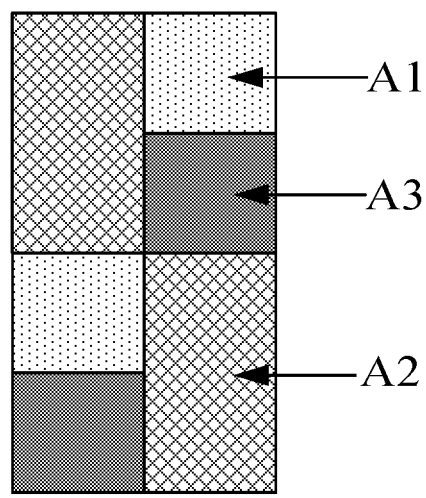
FIG. 7 is a front view of still a further phase retardation unit according to an embodiment of the present disclosure.

As shown in FIG. 7, the phase retardation unit A includes two first retardation regions A1, two second retardation regions A2, and two third retardation regions A3. The shapes of the first retardation region A1 and the third retardation region A3 are both square and the areas of the first retardation region A1 and the third retardation region A3 are equal. The shape of the second retardation region A2 is rectangular, and the area of the second retardation region A2 is equal to a sum of the areas of the first retardation region A1 and the third retardation region A3. The two first retardation regions A1, the two second retardation regions A2, and the two third retardation regions A3 are arranged in two columns. The lengths of the two columns are equal, and the widths of the two columns are equal. Each column has one first retardation region A1, one second retardation region A2, and one third retardation region A3. The two first retardation regions A1, the two second retardation regions A2, and the two third retardation regions A3 are arranged to form a rectangle.

Figure 8:
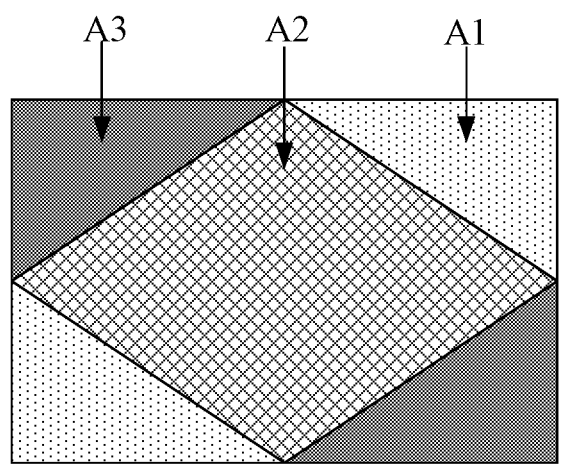
FIG. 8 is a front view of one additional phase retardation unit according to an embodiment of the present disclosure.

As shown in FIG. 8, the phase retardation unit A includes two first retardation regions A1, one second retardation region A2, and two third retardation regions A3. The shapes of the first retardation region A1 and the third retardation region A3 are both triangular and the areas of the first retardation region A1 and the third retardation region A3 are equal. The shape of the second retardation region A2 is rhombic. The two first retardation regions A1 are arranged on the side where one group of opposite edges of the second retardation region A2 are disposed. The two third retardation regions A3 are arranged on the side where the other group of opposite edges of the second retardation region A2 are disposed, and the two first retardation regions A1, one second retardation region A2, and two third retardation regions A3 are arranged to form a rectangle.

With reference to the principle of the embodiment shown in FIG. 1, the polarizer is configured to absorb external light. However, the conventional polarizer can only absorb the light of a single wavelength, resulting in color cast of the display device. The different retardation regions in the polarizer according to the embodiment of the present disclosure can perform quarter-phase retardation on the light of different colors, such that the polarizer can absorb the light of different colors. Therefore, the light of different colors in the reflected light emitted by the display device is more balanced in proportion, and the color cast of the display device can be improved. It is easy to understand in combination with the light absorption principle of the polarizer shown in FIG. 1 that the polarizer according to the embodiment of the present disclosure can absorb the external light without affecting the light emitted by the display panel, such that no negative impact is caused to the display effect.

It is easily understandable for those skilled in the art that the polarizer described in the embodiment of the present disclosure is only exemplary. In practical applications, the polarizers may also include a film layer, for example, an adhesive layer, which is not repeated by the embodiment of the present disclosure here.

In summary, in the polarizer according to the embodiment of the present disclosure, the optical retardation layer of the polarizer includes at least two types of retardation regions for performing phase retardation on incident light, a phase retardation amount of each type of retardation region includes a quarter of a wavelength of light of one color, and the phase retardation amounts of the at least two types of retardation regions include quarters of wavelengths of the light of at least two different colors. Therefore, the optical retardation layer can perform quarter-phase retardation on the light of at least two different colors, such that the polarizer completely absorbs the light of at least two different colors, which is favorable to improving the color cast of the display device.

The polarizer according to the embodiment of the present disclosure may be applied to the following method. The description in the following embodiments may be referred for a manufacturing method and a manufacturing principle of the polarizer in the embodiment of the present disclosure.

An embodiment of the present disclosure provides a method for manufacturing a polarizer. The method may be employed to manufacture the polarizer 11 shown in FIG. 2 or FIG. 3. The method may include:

forming an optical retardation layer and a linear polarization layer which are laminated, the optical retardation layer including at least two types of retardation regions for performing phase retardation on incident light;

wherein a phase retardation amount of each type of retardation region includes a quarter of a wavelength of light of one color, and the phase retardation amounts of the at least two types of retardation regions include quarters of wavelengths of light of at least two different colors.

In summary, according to the method for manufacturing the polarizer according to the embodiment of the present disclosure, the optical retardation layer of the polarizer includes at least two types of retardation regions for performing phase retardation on incident light, a phase retardation amount of each type of retardation region includes a quarter of a wavelength of light of one color, and the phase retardation amounts of the at least two types of retardation regions include quarters of wavelengths of the light of at least two different colors. Therefore, the optical retardation layer can perform quarter-phase retardation on the light of at least two different colors, such that the polarizer completely absorbs the light of at least two different colors, which is favorable to improving the color cast of the display device.

Optionally, forming the optical retardation layer and the linear polarization layer which are laminated includes:

forming the optical retardation layer including includes a first retardation region, a second retardation region, and a third retardation region, wherein a thickness of the first retardation region, a thickness of the second retardation region, and a thickness of the third retardation region are all equal, a refractive index difference of the first retardation region, a refractive index difference of the second retardation region, and a refractive index difference of the third retardation region are not equal from one another, the refractive index difference of any one of the retardation regions is a difference between a refractive index of the retardation region for ordinary light and a refractive index of the retardation region for extraordinary light, and slow axis directions of all the retardation regions in the optical retardation layer are parallel; and forming the linear polarization layer on the optical retardation layer, wherein an included angle between an absorption axis of the linear polarization layer and the slow axis direction of the retardation region is 45 degrees.

Optionally, forming the optical retardation layer includes the following steps.

forming a retardation alignment sub-layer;

forming a liquid crystal sub-layer on the retardation alignment sub-layer, wherein in the liquid crystal sub-layer, a liquid crystal of the first retardation region, a liquid crystal of the second retardation region, and a liquid crystal of the third retardation region are different from one another.

Optionally, forming the linear polarization layer on the optical retardation layer includes:

forming a linear polarization alignment sub-layer on the optical retardation layer, wherein an included angle between an alignment direction of the linear polarization alignment sub-layer and an alignment direction of the retardation alignment sub-layer is 45 degrees; and forming a dye liquid crystal sub-layer on the linear polarization alignment sub-layer by using the mixed material of a secondary dye and a polymer liquid crystal, wherein the secondary dye includes at least one of an azo dye, an anthraquinone dye, or an azomethine dye.

Optionally, forming the optical retardation layer and the linear polarization layer which are laminated includes:

forming the optical retardation layer comprising a first retardation region, a second retardation region, and a third retardation region, wherein a thickness of the first retardation region, a thickness of the second retardation region, and a thickness of the third retardation region are not equal from one another, a refractive index difference of the first retardation region, a refractive index difference of the second retardation region, and a refractive index difference of the third retardation region are all equal, the refractive index difference of any one of the retardation regions is a difference between a refractive index of the retardation region for ordinary light and a refractive index of the retardation region for extraordinary light, and slow axis directions of all the retardation regions in the optical retardation layer are parallel; and forming the linear polarization layer on the optical retardation layer, wherein an included angle between the absorption axis of the linear polarization layer and the slow axis direction of the retardation region is 45 degrees.

Optionally, forming the optical retardation layer includes:

forming a retardation alignment sub-layer; and forming a liquid crystal sub-layer on the retardation alignment sub-layer, wherein in the liquid crystal sub-layer, a liquid crystal of the first retardation region, a liquid crystal of the second retardation region, and a liquid crystal of the third retardation region are all the same.

Optionally, forming the linear polarization layer on the optical retardation layer includes:

forming a linear polarization alignment sub-layer on the optical retardation layer, wherein an included angle between the alignment direction of the linear polarization alignment sub-layer and the alignment direction of the retardation alignment sub-layer is 45 degrees; and forming a dye liquid crystal sub-layer on the linear polarization alignment sub-layer by using the mixed material of a secondary dye and a polymer liquid crystal, wherein the secondary dye includes at least one of an azo dye, an anthraquinone dye or an azomethine dye.

All the above optional technical solutions can be combined in any way to form an optional embodiment of the present disclosure, which are not repeated herein.

Figure 9:
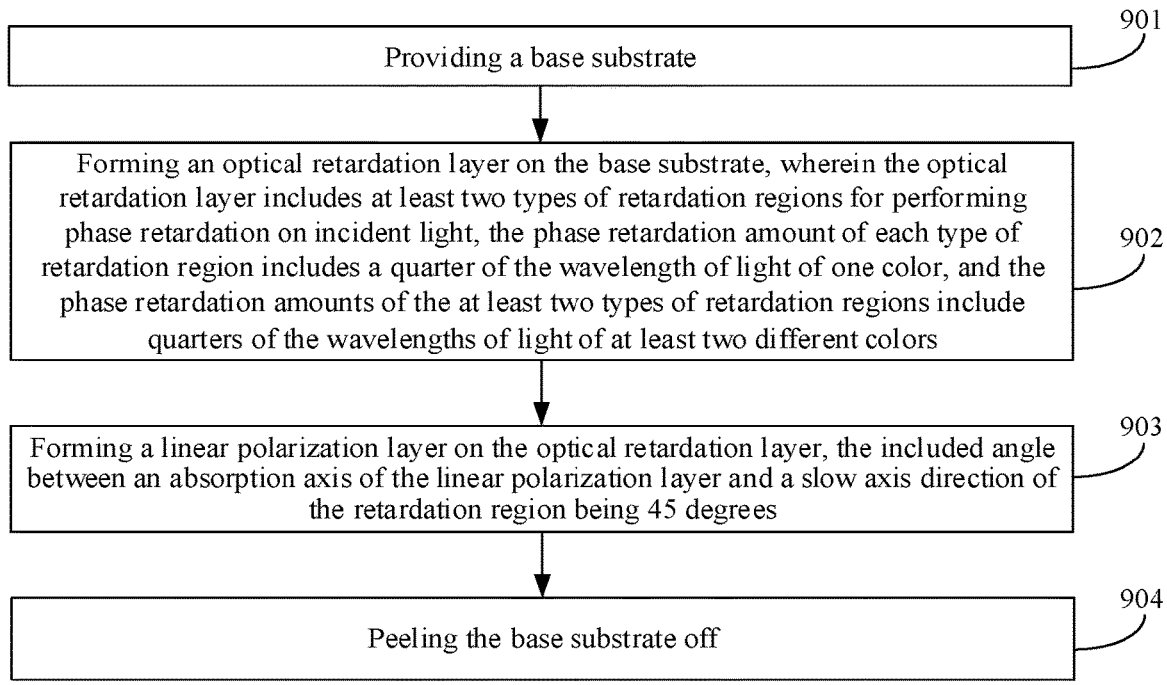
FIG. 9 is a flowchart of a method for manufacturing a polarizer according to an embodiment of the present disclosure.

Referring to FIG. 9, FIG. 9 shows a flowchart of a method for manufacturing a polarizer according to an embodiment of the present disclosure. The embodiment of the present disclosure takes the manufacturing of the polarizer 11 shown in FIG. 2 and FIG. 3 as an example for illustration. Referring to FIG. 9, the method may include the following steps.

In step 901, a base substrate is provided.

The base substrate may be any plate which has a certain rigidity and can be used as a substrate. Exemplarily, the base substrate may be a glass substrate, a display panel or the like, which is not limited in the embodiment of the present disclosure.

In step 902, an optical retardation layer is formed on the base substrate. The optical retardation layer includes at least two types of retardation regions for performing phase retardation on incident light. A phase retardation amount of each type of retardation region includes a quarter of a wavelength of the light of one color, and the phase retardation amounts of the at least two types of retardation regions include quarters of wavelengths of light of at least two different colors.

In the optical retardation layer, slow axis directions of all retardation regions are parallel. As shown in FIG. 2, the at least two types of retardation regions include a first retardation region A1, a second retardation region A2, and a third retardation region A3. The slow axis directions of the first retardation region A1, the second retardation region A2, and the third retardation region A3 are parallel. The phase retardation amount of the first retardation region A1 includes a quarter of the wavelength of blue light, and the first retardation region A1 can perform quarter-phase retardation on the blue light. The phase retardation amount of the second retardation region A2 includes a quarter of the wavelength of green light, and the second retardation region A2 can perform quarter-phase retardation on the green light. The phase retardation amount of the third retardation region A3 includes a quarter of the wavelength of red light. The third retardation region A3 can perform quarter-phase retardation on the red light.

Optionally, as shown in FIG. 2, the optical retardation layer 111 includes a plurality of optical retardation units A arranged in an array. Each optical retardation unit A includes at least one first retardation region A1, at least one second retardation region A2 and at least one third retardation region A3, and each optical retardation unit A may be an optical retardation unit A as shown in any one of FIG. 4 to FIG. 8.

Optionally, a thickness of the first retardation region A1, a thickness of the second retardation region A2, and a thickness of the third retardation region A3 are all equal; and a refractive index difference of the first retardation region A1, a refractive index difference of the second retardation region A2, and a refractive index difference of the third retardation region A3 are not equal from one another. Optionally, a thickness of the first retardation region A1, a thickness of the second retardation region A2, and a thickness of the third retardation region A3 are not equal from one another; and a refractive index difference of the first retardation region A1, a refractive index difference of the second retardation region A2, and a refractive index difference of the third retardation region A3 are all equal. In this way, the thicknesses and refractive index differences of the first retardation region A1, the second retardation region A2, and the third retardation region A3 may be respectively set, such that the phase retardation amount of the first retardation region A1 includes a quarter of the wavelength of the blue light, the phase retardation amount of the second retardation region A2 includes a quarter of the wavelength of the green light, and the phase retardation amount of the third retardation region A3 includes a quarter of the wavelength of the red light.

Figure 10:
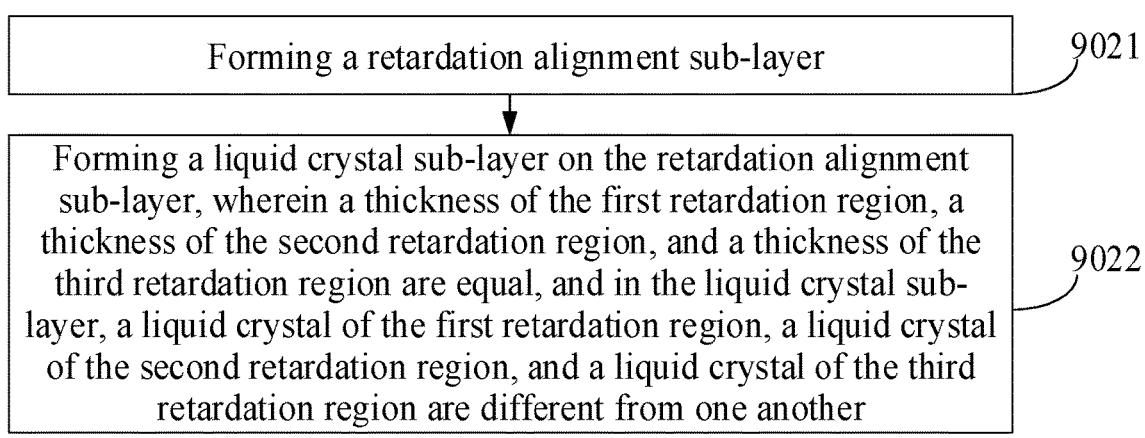
FIG. 10 is a flowchart of a method of forming an optical retardation layer according to an embodiment of the present disclosure.

Those skilled in the art easily know that the liquid crystal can cause the phase retardation of light and convert linear polarization light into circular polarization light. The refractive index differences of different liquid crystals are usually different. In the embodiment of the present disclosure, the optical retardation layer may be formed by using the liquid crystal as a material. Exemplarily, referring to FIG. 10, FIG. 10 shows a flowchart of a method of forming an optical retardation layer according to the present disclosure. Referring to FIG. 10, the method may include the following steps.

In sub-step 9021, a retardation alignment sub-layer is formed on the base substrate.

Referring to FIG. 11, FIG. 11 shows a schematic diagram after a retardation alignment sub-layer 1111 is formed on a base substrate G according to an embodiment of the present disclosure. A material of the retardation alignment sub-layer 1111 may include PI.

Optionally, any coating process, for example spray coating or spin coating, may be configured to form a PI layer on the base substrate G, and then the PI layer is aligned and cured to obtain the retardation alignment sub-layer 1111. Exemplarily, an alignment roller is configured to align the PI layer.

In sub-step 9022, a liquid crystal sub-layer is formed on the retardation alignment sub-layer. The thickness of the first retardation region, the thickness of the second retardation region, and the thickness of the third retardation region are equal. In the liquid crystal sub-layer, a liquid crystal in the first retardation region, a liquid crystal of the second retardation region, and a liquid crystal of the third retardation region are different from one another.

Referring to FIG. 12, FIG. 12 shows a schematic diagram after a liquid crystal sub-layer 1112 is formed on the retardation alignment sub-layer 1111 according to an embodiment of the present disclosure. After the liquid crystal sub-layer 1112 is formed on the retardation alignment sub-layer 1111, the retardation alignment sub-layer 1111 and the liquid crystal sub-layer 1112 are laminated to form the optical retardation layer 111. Referring to FIG. 12 and in conjunction with FIG. 2, the optical retardation layer 111 includes a plurality of optical retardation units A arranged in an array, and each optical retardation unit A includes at least one first retardation region A1, at least one second retardation region A2 and at least one third retardation region A3. The thickness of the first retardation region A1, the thickness of the second retardation region A2 and the thickness of the third retardation region A3 are all equal. In the liquid crystal sub-layer 1112, the liquid crystal of the first retardation region A1, the liquid crystal of the second retardation region A2, and the liquid crystal of the third retardation region A3 are different from one another, such that the refractive index difference of the first retardation region A1, the refractive index difference of the second retardation region A2 and the refractive index difference of the third retardation region A3 are not equal.

Exemplarily, the embodiment of the present disclosure takes the fact that the liquid crystal of the first retardation region A1 is a first liquid crystal, the liquid crystal of the second retardation region A2 is a second liquid crystal, and the liquid crystal of the third retardation region A3 is a third liquid crystal as an example. Forming the liquid crystal sub-layer 1112 on the retardation alignment sub-layer 1111 may include: firstly, forming a first liquid crystal layer on the retardation alignment sub-layer 1111, exposing and developing the first liquid crystal layer by using a mask with the same pattern as the first retardation region A1 to obtain a first liquid crystal region, and laminating the first liquid crystal region and the retardation alignment sub-layer 1111 to form the first retardation region A1; then forming a second liquid crystal layer on the retardation alignment sub-layer 1111 with the first liquid crystal region, exposing and developing the second liquid crystal layer by using a mask with the same pattern as the second retardation region A2 to obtain a second liquid crystal region, and laminating the second liquid crystal region and the retardation alignment sub-layer 1111 to form the second retardation region A2; and finally, forming a third liquid crystal layer on the retardation alignment sub-layer 1111 with the first liquid crystal region and the second liquid crystal region, exposing and developing the third liquid crystal layer by using a mask with the same pattern as the third retardation region A3 to obtain a third liquid crystal region, and laminating the third liquid crystal region and the retardation alignment sub-layer 1111 to form the third retardation region A3.

Those skilled in the art can easily understand that the embodiment of the present disclosure takes the fact that the thickness of the first retardation region, the thickness of the second retardation region, and the thickness of the third retardation region are equal as an example to illustrate the process of forming the liquid crystal sub-layer. When the thickness of the first retardation region, the thickness of the second retardation region, and the thickness of the third retardation region are not equal from one another, the liquid crystal of the first retardation region, the liquid crystal of the second retardation region and the liquid crystal of the third retardation region in the liquid crystal sub-layer may be the same. In this case, the process of forming the liquid crystal sub-layer may refer to sub-step 9022, which is not repeated here in the embodiment of the present disclosure.

In step 903, a linear polarization layer is formed on the optical retardation layer, and the included angle between an absorption axis of the linear polarization layer and a slow axis direction of the retardation region is 45 degrees.

Optionally, referring to FIG. 13, FIG. 13 shows a flow-chart of a method of forming a linear polarization layer according to an embodiment of the present disclosure. Referring to FIG. 13, the method may include the following steps.

In sub-step 9031, a linear polarization alignment sub-layer is formed on the optical retardation layer, wherein an included angle between an alignment direction of the linear polarization alignment sub-layer and an alignment direction of the retardation alignment sub-layer is 45 degrees.

Figure 14:
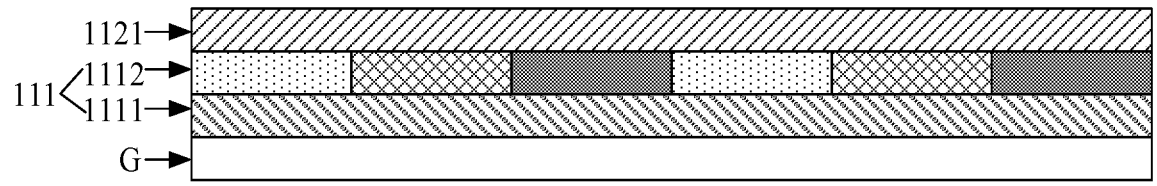
FIG. 14 is a schematic diagram after an alignment sub-layer is formed on an optical retardation layer according to an embodiment of the present disclosure.

Referring to FIG. 14, FIG. 14 shows a schematic diagram after a linear polarization alignment sub-layer 1121 is formed on the optical retardation layer 111 according to an embodiment of the present disclosure. A material of the linear polarization alignment sub-layer 1121 may be PI.

Optionally, any coating process, for example spray coating or spin coating, may be configured to form a PI layer on the optical retardation layer 111, and then the PI layer is aligned and cured to obtain the linear polarization alignment sub-layer 1121. Exemplarily, an alignment roller is configured to align the PI layer. The included angle between the alignment direction of the linear polarization alignment sub-layer 1121 and the alignment direction of the retarded alignment sub-layer 1111 may be 45 degrees.

In sub-step 9032, the mixed material of a secondary dye and a polymer liquid crystal is configured to form a dye liquid crystal sub-layer on the linear polarization alignment sub-layer.

Figure 15:
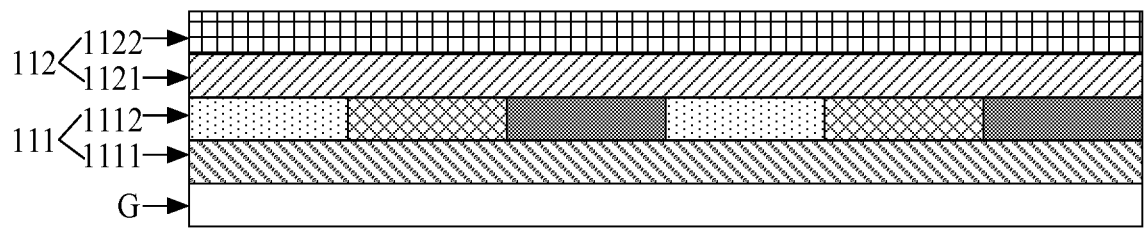
FIG. 15 is a schematic diagram after a dye liquid crystal sub-layer is formed on an alignment sub-layer according to an embodiment of the present disclosure.

Referring to FIG. 15, FIG. 15 shows a schematic diagram after a dye liquid crystal sub-layer 1122 is formed on the linear polarization alignment sub-layer 1121 according to an embodiment of the present disclosure. After the dye liquid crystal sub-layer 1122 is formed on the linear polarization alignment sub-layer 1121, the linear polarization alignment sub-layer 1121 and the dye liquid crystal sub-layer 1122 are laminated to form the linear polarization layer 112, and the optical retardation layer 111 and the linear polarization layer 112 are laminated to form the polarizer 11. A material of the dye liquid crystal sub-layer 1122 may include a mixed material of a secondary dye and a polymer liquid crystal, wherein the secondary dye may be at least one of an azo dye, an anthraquinone dye, or an azomethine dye.

Optionally, the secondary dye and the polymer liquid crystal may be mixed to obtain a mixed material of the secondary dye and the polymer liquid crystal, then the linearly deviated alignment sub-layer 1121 is coated with the mixed material, and the coated mixed material is cured to obtain the dye liquid crystal sub-layer 1122.

In step 904, the base substrate is peeled off.

FIG. 3 may be referred for a schematic diagram after the base substrate G is peeled off. Optionally, the base substrate G may be peeled off by a laser lift-off process. Exemplarily, laser is irradiated the base substrate G from one side of the base substrate G distal from the polarizer 11, and under the action of the laser, an adhesive force between the base substrate G and the polarizer 11 is removed, and the base substrate G is peeled off.

The sequence of the steps in the method for manufacturing a polarizer according to the embodiment of the present disclosure may be adjusted appropriately, and the steps may be increased or decreased accordingly according to the situation. Any varied methods easily conceivable for anyone skilled in the art within the technical scope disclosed in the present disclosure should be covered by the scope of protection of the present disclosure, and thus will not be repeated.

In summary, according to the method for manufacturing the polarizer according to the embodiment of the present disclosure, the optical retardation layer of the polarizer includes at least two types of retardation regions for performing phase retardation on incident light, a phase retardation amount of each type of retardation region includes a quarter of a wavelength of light of one color, and the phase retardation amounts of the at least two types of retardation regions include quarters of wavelengths of the light of at least two different colors. Therefore, the optical retardation layer can perform quarter-phase retardation on the light of at least two different colors, such that the polarizer completely absorbs the light of at least two different colors, which is favorable to improving the color cast of the display device.

Based on the same inventive concept, an embodiment of the present disclosure provides a display device, which includes the polarizer 11 shown in FIG. 2 or FIG. 3.

Figure 16:
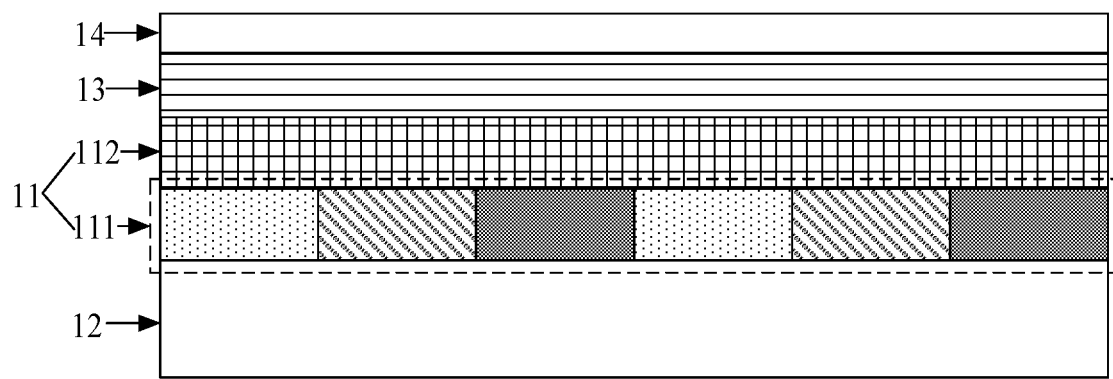
FIG. 16 is a schematic structural diagram of a display device according to an embodiment of the present disclosure.

Exemplarily, referring to FIG. 16, FIG. 16 shows a schematic structural diagram of a display device according to an embodiment of the present disclosure. Referring to FIG. 16, the display device includes: a display panel 12, and the polarizer 11 on a light-emergent side of the display panel 12. FIG. 16 takes the polarizer 11 as shown in FIG. 3 as an example for illustration. The polarizer 11 includes an optical retardation layer 111 and a linear polarization layer 112 which are laminated, wherein the optical retardation layer 111 is disposed between the linear polarization layer 112 and the display panel 12.

In the embodiment of the present disclosure, the display panel 12 may be an electroluminescent display panel, for example, an OLED display panel or a quantum dot light-emitting diode (QLED) display panel. The polarizer 11 may be a circular polarizer, and the polarizer 11 is disposed on the light-emergent side of the display panel 12 and can absorb external light so as to prevent the external light from affecting a display effect of the display panel 12. The electroluminescent display panel may include an encapsulation layer, and the polarizer 11 may be disposed on the encapsulation layer of the electroluminescent display panel.

Optionally, the display device may be a touch display device. As shown in FIG. 16, the display device further includes: a touch layer 13 disposed on the side of the polarizer 11 distal from the display panel 12, and a protective layer 14 disposed on the side of the control layer 13 distal from the display panel 12. The touch layer 13 may include a plurality of touch electrodes, wherein the plurality of touch electrodes are configured for touch point recognition. The protective layer 14 is configured to protect the touch layer 13 and avoid the contact of the touch electrodes of the touch layer 13 with the outside, thereby avoiding damages to the touch electrodes from the outside.

Optionally, when the display device is manufactured, the display panel 12 may be manufactured first, and then the display panel 12 may be used as the base substrate shown in FIG. 9. Steps 902 and 903 may be implemented to form the polarizer 11 on the light-emergent side of the display panel 12, and then the touch layer 13 and the protective layer 14 are sequentially formed on the side of the polarizer 11 distal from the display panel 12 to obtain the display device.

In summary, according to the display device according to the embodiment of the present disclosure, in the display device, the optical retardation layer of the polarizer includes at least two types of retardation regions for performing phase retardation on incident light, a phase retardation amount of each type of retardation region includes a quarter of a wavelength of light of one color, and the phase retardation amounts of the at least two types of retardation regions include quarters of wavelengths of the light of at least two different colors. Therefore, the optical retardation layer can perform quarter-phase retardation on the light of at least two different colors, such that the polarizer completely absorbs the light of at least two different colors, which is favorable to improving the color cast of the display device.

In the present disclosure, the terms such as "first", "second" and "third" are merely for a descriptive purpose, and cannot be understood as indicating or implying a relative importance. The term "at least one" means one or more than one, unless otherwise defined. The term "at least one of B and C" merely describes the association relationship between the associated objects and indicates that there may be three relationships; for example, at least one of B or C may indicate three cases where only B exists, B and C exist at the same time, or only C exists. Similarly, "at least one of B, C or D" indicates that there may be seven relationships and may indicate seven cases where only B exists, only C exists, only D exits, B and C exist at the same time, B and D exist at the same time, C and D exist at the same time, or B, C and D exit at the same time. Similarly, "at least one of B, C, D and E" indicates that there may be fifteen relationships and may indicate fifteen cases where only B exists, only C exists, only D exits, only E exists, B and C exist at the same time, B and D exist at the same time, B and E exist at the same time, D and C exist at the same time, E and C exist at the same time, D and E exist at the same time, B, C and D exit at the same time, B, C and E exist at the same time, B, D and E exist at the same time, C, D and E exist at the same time, or B, C, D and E exist at the same time.

Described above are merely exemplary embodiments of the present disclosure, and are not intended to limit the present disclosure. Within the spirit and principles of the disclosure, any modifications, equivalent substitutions, improvements, and the like are within the protection scope of the present disclosure.

What is claimed is:

1. A polarizer, comprising: an optical retardation layer and a linear polarization layer which are laminated; wherein
the optical retardation layer comprises a first retardation region, a second retardation region, and a third retardation region for performing phase retardation on incident light, a phase retardation value of the first retardation region comprising a quarter of a wavelength of blue light, a phase retardation value of the second retardation region comprising a quarter of a wavelength of green light, and a phase retardation value of the third retardation region comprising a quarter of a wavelength of red light; wherein an area of the first retardation region is equal to an area of the third retardation region, and an area of the second retardation region is greater than the area of the first retardation region;
the optical retardation layer comprises a retardation alignment sub-layer and a liquid crystal sub-layer, the retardation alignment sub-layer being configured to align the liquid crystal sub-layer; and
a thickness of the first retardation region, a thickness of the second retardation region, and a thickness of the third retardation region are all equal, and in the liquid crystal sub-layer, a liquid crystal of the first retardation region, a liquid crystal of the second retardation region, and a liquid crystal of the third retardation region are different from one another, such that a refractive index difference of the first retardation region, a refractive index difference of the second retardation region, and a refractive index difference of the third retardation region are not equal from one another; or
a thickness of the first retardation region, a thickness of the second retardation region, and a thickness of the third retardation region are not equal from one another, and in the liquid crystal sub-layer, a liquid crystal of the first retardation region, a liquid crystal of the second retardation region, and a liquid crystal of the third retardation region are the same, such that a refractive index difference of the first retardation region, a refractive index difference of the second retardation region, and a refractive index difference of the third retardation region are all equal;
wherein the refractive index difference of any retardation region is a difference between a refractive index of the retardation region for ordinary light and a refractive index of the retardation region for extraordinary light.

2. The polarizer according to claim 1, wherein
the phase retardation value of the first retardation region ranges from 107.5 to 117.5 nanometers;
the phase retardation value of the second retardation region ranges from 132.5 to 142.5 nanometers; and
the phase retardation value of the third retardation region ranges from 157.5 to 167.5 nanometers.

3. The polarizer according to claim 1, wherein slow axis directions of all the retardation regions in the optical retardation layer are parallel, and an included angle between the slow axis direction of the retardation region and an absorption axis of the linear polarization layer is 45 degrees.

4. The polarizer according to claim 1, wherein the linear polarization layer comprises a linear polarization alignment sub-layer and a dye liquid crystal sub-layer which are laminated;
wherein a material of the dye liquid crystal sub-layer comprises a mixed material of a secondary dye and a polymer liquid crystal, and the linear polarization alignment sub-layer is configured to align the dye liquid crystal sub-layer, the secondary dye comprising at least one of an azo dye, an anthraquinone dye, or an azomethine dye.

5. The polarizer according to claim 1, wherein
the phase retardation value of the first retardation region ranges from 107.5 to 117.5 nanometers, the phase retardation value of the second retardation region ranges from 132.5 to 142.5 nanometers, and the phase retardation value of the third retardation region ranges from 157.5 to 167.5 nanometers; and
the linear polarization layer comprises a linear polarization alignment sub-layer and a dye liquid crystal sub-layer which are laminated, wherein a material of the dye liquid crystal sub-layer comprises a mixed material of a secondary dye and a polymer liquid crystal, and the linear polarization alignment sub-layer is configured to align the dye liquid crystal sub-layer, and the secondary dye comprising at least one of an azo dye, an anthraquinone dye, or an azomethine dye.

6. The polarizer according to claim 1, wherein a thickness of the optical retardation layer ranges from 1 to 2 micrometers.

7. The polarizer according to claim 1, wherein in the optical retardation layer, a number of first retardation regions, a number of second retardation regions, and a number of third retardation regions in an area per inch are each not less than 100, and a shape of each retardation region is a polygon.

8. A method for manufacturing a polarizer, comprising:
forming an optical retardation layer, wherein the optical retardation layer comprises a first retardation region, a second retardation region, and a third retardation region for performing phase retardation on incident light, a phase retardation value of the first retardation region comprising a quarter of a wavelength of blue light, a phase retardation value of the second retardation region comprising a quarter of a wavelength of green light, and a phase retardation value of the third retardation region comprising a quarter of a wavelength of red light; wherein an area of the first retardation region is equal to an area of the third retardation region, and an area of the second retardation region is greater than the area of the first retardation region; and
forming a linear polarization layer on the optical retardation layer;
wherein forming the optical retardation layer comprises:
forming a retardation alignment sub-layer, and
forming a liquid crystal sub-layer on the retardation alignment sub-layer, wherein the retardation alignment sub-layer is configured to align the liquid crystal sub-layer;
wherein a thickness of the first retardation region, a thickness of the second retardation region, and a thickness of the third retardation region are all equal, and in the liquid crystal sub-layer, a liquid crystal of the first retardation region, a liquid crystal of the second retardation region, and a liquid crystal of the third retardation region are different from one another, such that a refractive index difference of the first retardation region, a refractive index difference of the second retardation region, and a refractive index difference of the third retardation region are not equal from one another; or
a thickness of the first retardation region, a thickness of the second retardation region, and a thickness of the third retardation region are not equal from one another, and in the liquid crystal sub-layer, a liquid crystal of the first retardation region, a liquid crystal of the second retardation region, and a liquid crystal of the third retardation region are the same, such that a refractive index difference of the first retardation region, a refractive index difference of the second retardation region, and a refractive index difference of the third retardation region are all equal;
and wherein the refractive index difference of any retardation region is a difference between a refractive index of the retardation region for ordinary light and a refractive index of the retardation region for extraordinary light.

9. The method according to claim 8, wherein
forming the linear polarization layer on the optical retardation layer comprises:
forming a linear polarization alignment sub-layer on the optical retardation layer, wherein an included angle between an alignment direction of the linear polarization alignment sub-layer and an alignment direction of the retardation alignment sub-layer is 45 degrees; and
forming a dye liquid crystal sub-layer on the linear polarization alignment sub-layer by using a mixed material of a secondary dye and a polymer liquid crystal, wherein the secondary dye comprises at least one of an azo dye, an anthraquinone dye, or an azomethine dye.

10. A display device, comprising:
a display panel, and a polarizer on a light-emergent side of the display panel, wherein the polarizer comprises an optical retardation layer and a linear polarization layer which are laminated, the optical retardation layer being between the linear polarization layer and the display panel;
wherein the optical retardation layer comprises a first retardation region, a second retardation region, and a third retardation region for performing phase retardation on incident light, a phase retardation value of the first retardation region comprising a quarter of a wavelength of blue light, a phase retardation value of the second retardation region comprising a quarter of a wavelength of green light, and a phase retardation value of the third retardation region comprising a quarter of a wavelength of red light; wherein an area of the first retardation region is equal to an area of the third retardation region, and an area of the second retardation region is greater than an area of the first retardation region;
the optical retardation layer comprises a retardation alignment sub-layer and a liquid crystal sub-layer, the retardation alignment sub-layer being configured to align the liquid crystal sub-layer; and
a thickness of the first retardation region, a thickness of the second retardation region, and a thickness of the third retardation region are all equal, and in the liquid crystal sub-layer, a liquid crystal of the first retardation region, a liquid crystal of the second retardation region, and a liquid crystal of the third retardation region are different from one another, such that a refractive index difference of the first retardation region, a refractive index difference of the second retardation region, and a refractive index difference of the third retardation region are not equal from one another; or a thickness of the first retardation region, a thickness of the second retardation region, a thickness of the first retardation region, a thickness of the second retardation region, and a thickness of the third retardation region are not equal from one another, and in the liquid crystal sub-layer, a liquid crystal of the first retardation region, a liquid crystal of the second retardation region, and a liquid crystal of the third retardation region are the same, such that a refractive index difference of the first retardation region, a refractive index difference of the second retardation region, and a refractive index difference of the third retardation region are all equal;

wherein the refractive index difference of any retardation region is a difference between a refractive index of the retardation region for ordinary light and a refractive index of the retardation region for extraordinary light.

* * * * *